(12) United States Patent
Cheng et al.

(10) Patent No.: US 10,074,652 B1
(45) Date of Patent: Sep. 11, 2018

(54) VERTICAL FET WITH REDUCED PARASITIC CAPACITANCE

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Philip J. Oldiges, Lagrangeville, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/808,124

(22) Filed: Nov. 9, 2017

Related U.S. Application Data

(63) Continuation of application No. 15/488,780, filed on Apr. 17, 2017, now Pat. No. 9,853,028.

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823431* (2013.01); *H01L 21/823475* (2013.01); *H01L 21/823481* (2013.01); *H01L 29/6656* (2013.01); *H01L 29/66666* (2013.01); *H01L 29/7827* (2013.01)

(58) Field of Classification Search
CPC ..... H01L 21/823431; H01L 21/823481; H01L 21/823475; H01L 29/7851; H01L 29/7827; H01L 29/41791; H01L 27/0886
See application file for complete search history.

(56) References Cited

U.S. PATENT DOCUMENTS

| | | |
|---|---|---|
| 5,087,581 A | 2/1992 | Rodder |
| 5,250,450 A | 10/1993 | Lee et al. |

(Continued)

OTHER PUBLICATIONS

List of IBM Patents or Patent Applications Treated as Related dated Nov. 9, 2017, 2 pages.

(Continued)

*Primary Examiner* — Christine Enad
(74) *Attorney, Agent, or Firm* — Tutunjian & Bitetto, P.C.; Vazken Alexanian

(57) ABSTRACT

A method for reducing parasitic capacitance of a semiconductor structure is provided. The method includes forming a fin structure over a substrate, forming a first source/drain region between the fin structure and the substrate, forming first spacers adjacent the fin structure, forming second spacers adjacent the first source/drain region and recessing the first source/drain region in exposed areas. The method further includes forming a shallow trench isolation (STI) region within the exposed areas of the recessed first source/drain region, depositing a bottom spacer over the STI region, forming a metal gate stack over the bottom spacer, depositing a top spacer over the metal gate stack, cutting the metal gate stack, forming a second source/drain region over the fin structure, and forming contacts such the STI region extends a length between the metal gate stack and the first source/drain region.

20 Claims, 8 Drawing Sheets

(51) Int. Cl.
*H01L 29/66* (2006.01)
*H01L 29/78* (2006.01)

(56) References Cited

U.S. PATENT DOCUMENTS

| | | | |
|---|---|---|---|
| 7,446,025 B2 | 11/2008 | Cohen et al. | |
| 8,362,572 B2 | 1/2013 | Huang et al. | |
| 9,287,362 B1 | 3/2016 | Basi et al. | |
| 9,337,306 B2 | 5/2016 | Peng et al. | |
| 9,368,572 B1 | 6/2016 | Cheng et al. | |
| 9,437,503 B1 | 9/2016 | Mallela et al. | |
| 9,799,776 B2 * | 10/2017 | Liu | H01L 29/7883 |
| 2015/0069458 A1 * | 3/2015 | Li | H01L 29/66795 |
| | | | 257/105 |
| 2016/0365456 A1 * | 12/2016 | Liu | H01L 29/7883 |

OTHER PUBLICATIONS

Kunz et al."Reduction of Parasitic Capacitance in Vertical MOSFETs by Spacer Local Oxidation", IEEE Transactions on Electron Devices, vol. 50, No, 6. Jul. 22, 2003. pp. 1497-1493.
Cheng, "Reduced Capacitance in Vertical Transistors", U.S. Appl. No. 15/282,398, filed Sep. 30, 2016. pp. 1-24.

* cited by examiner

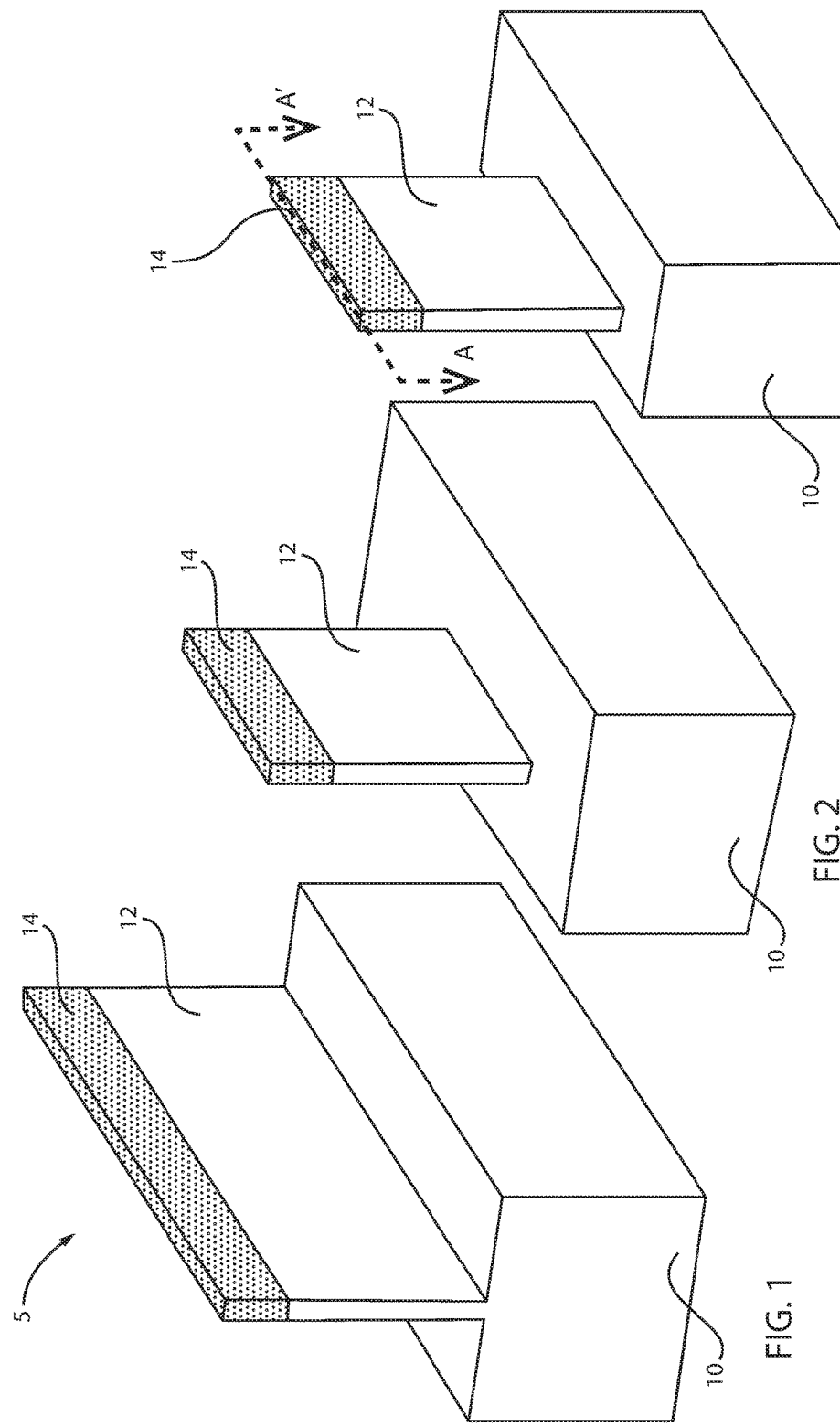

US 10,074,652 B1

VERTICAL FET WITH REDUCED PARASITIC CAPACITANCE

BACKGROUND

Technical Field

The present invention relates generally to semiconductor devices, and more specifically, to forming a vertical field effect transistor (FET) with reduced parasitic capacitance.

Description of the Related Art

A field effect transistor (FET) is a transistor having a source, a gate, and a drain. The action of the FET depends on the flow of majority carriers along a channel between the source and drain that runs past the gate. Current through the channel, which is between the source and drain, is controlled by the transverse electric field under the gate. More than one gate (multi-gate) can be used to more effectively control the channel. The length of the gate determines how fast the FET switches.

The size of FETs has been reduced through the use of one or more fin-shaped channels. A FET employing such a channel structure can be referred to as a FinFET. Fins use a vertical channel structure in order to maximize the surface area of the channel that is exposed to the gate. The gate controls the channel more strongly because it extends over more than one side (surface) of the channel. In some devices the gate can completely enclose the channel, i.e., a suspended channel passes through the gate and all surfaces of the channel are exposed to the gate. One challenge in fabricating multi-gate FETs is the inherently high parasitic capacitance as compared to conventional planar FETs.

SUMMARY

In accordance with an embodiment, a method for reducing parasitic capacitance of a semiconductor structure is provided. The method includes forming a fin structure over a substrate, forming a first source/drain region between the fin structure and the substrate, forming first spacers adjacent the fin structure, forming second spacers adjacent the first source/drain region and recessing the first source/drain region in exposed areas. The method further includes forming a shallow trench isolation (STI) region within the exposed areas of the recessed first source/drain region, depositing a bottom spacer over the STI region, forming a metal gate stack over the bottom spacer, depositing a top spacer over the metal gate stack, cutting the metal gate stack, forming a second source/drain region over the fin structure, and forming contacts such the STI region extends a length between the metal gate stack and the first source/drain region.

In accordance with an embodiment, a semiconductor structure for reducing parasitic capacitance is provided. The semiconductor structure includes a fin structure formed over a substrate, a first source/drain region formed between the fin structure and the substrate, first spacers formed adjacent the fin structure, and second spacers formed adjacent the first source/drain region, where the first source/drain region is recessed in exposed areas. The semiconductor structure further includes a shallow trench isolation (STI) region formed within the exposed areas of the recessed first source/drain region, a bottom spacer deposited over the STI region, a metal gate stack formed over the bottom spacer, a top spacer deposited over the metal gate stack, the metal gate stack being cut, a second source/drain region formed over the fin structure, and contacts formed such the STI region extends a length between the metal gate stack and the first source/drain region.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 1 is a perspective view of a fin formed over a semiconductor substrate, in accordance with the present invention;

FIG. 2 is a perspective view of the structure of FIG. 1 where the fin is cut, in accordance with the present invention;

FIG. 3 is a perspective view of the structure of FIG. 2 where a cut is performed to form an active region, in accordance with the present invention;

Throughout the drawings, same or similar reference numerals represent the same or similar elements.

DETAILED DESCRIPTION

Figure 5:
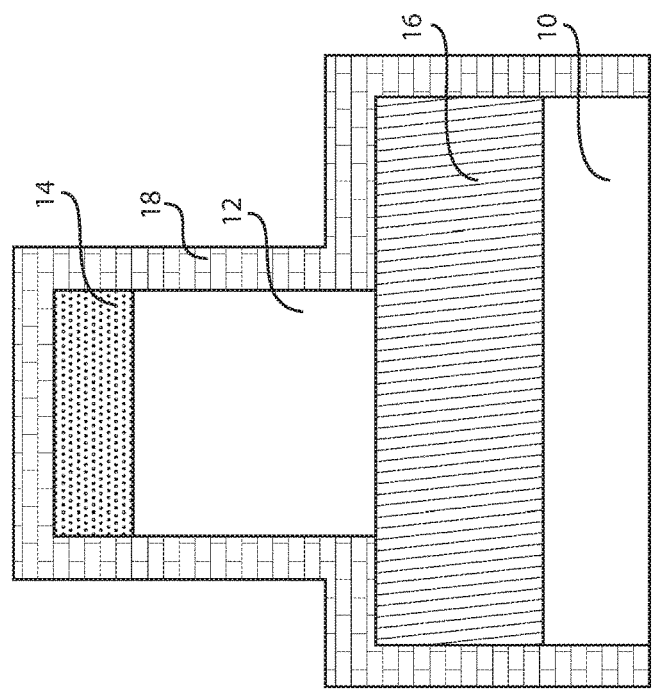
FIG. 5 is a cross-sectional view of the structure of FIG. 4 where a first source/drain region is formed and a conformal dielectric liner is deposited, in accordance with the present invention.

Embodiments in accordance with the present invention provide methods and devices for reducing parasitic capacitance in vertical field effect transistor (VFET) devices. FETs are usually formed on semiconductor substrates and include a channel region disposed between source and drain regions, and a gate configured to electrically connect the source and drain regions through the channel region. Structures where the channel region is parallel to the main surface of the substrate are referred to as planar FET structures, while structures where the channel region is perpendicular to the main surface of the substrate are referred to as VFETS. Thus, in a VFET device the direction of the current flow between the source and drain regions is normal to the main surface of the substrate. A VFET device includes a vertical fin or nanowire that extends upward from the substrate. The fin or nanowire forms the channel region of the transistor. A source region and a drain region are situated in electrical contact with the top and bottom ends of the channel region, while the gate is disposed on one or more of the fin or nanowire sidewalls. In a vertical FET architecture, the contacted gate pitch can be decoupled from the gate length. However, in a vertical FET the contact to the bottom source/drain (S/D) is formed from the top of the structure such that the bottom S/D contact overlaps the gate. This overlapping configuration creates an undesired parasitic capacitance between adjacent conductive elements.

Embodiments in accordance with the present invention provide methods and devices for reducing parasitic capacitance by reducing the overlap between the gate and the bottom source/drain (S/D). The distance between the gate and the bottom S/D is extended to be greater than about 10 nm, which in turn increases the maximum voltage (Vmax) of the device. Embodiments in accordance with the present invention provide methods and devices for forming VFETs with hybrid spacers of reverse-stepped shape to further reduce the gate-to-source/drain capacitances and improve the maximum operating voltage.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a perspective view of a fin formed over a semiconductor substrate, in accordance with the present invention.

A semiconductor structure 5 includes a semiconductor substrate 10. A fin 12 is formed over the substrate 10. A hard mask 14 can be formed over the fin 12.

In one or more embodiments, the substrate 10 can be a semiconductor or an insulator with an active surface semiconductor layer. The substrate 10 can be crystalline, semi-crystalline, microcrystalline, or amorphous.

FIG. 2 is a perspective view of the structure of FIG. 1 where the fin is cut, in accordance with the present invention.

In various example embodiments, the fin 12 is cut. The fin 12 can be cut by etching. Conventionally, two separate fin removal or "fin cut" etching processes, involving two different etching masks, are performed to remove the unwanted fins (or portions thereof). One of these fin-removal etching processes is sometimes referred to as a so-called "FC cut" process, while the other fin-removal etching process is sometimes referred to as a so-called "FH cut" process. The FC cut and the FH cut can be performed in either order, although usually the FC cut process is performed first. The FC cut process is performed to cut the fins 12 in the direction that crosses the plurality of fins 12 by removing portions of the axial length of the fins exposed by an FC cut mask (e.g., photoresist).

FIG. 3 is a perspective view of the structure of FIG. 2 where a cut is performed to form an active region, in accordance with the present invention.

Figure 4:
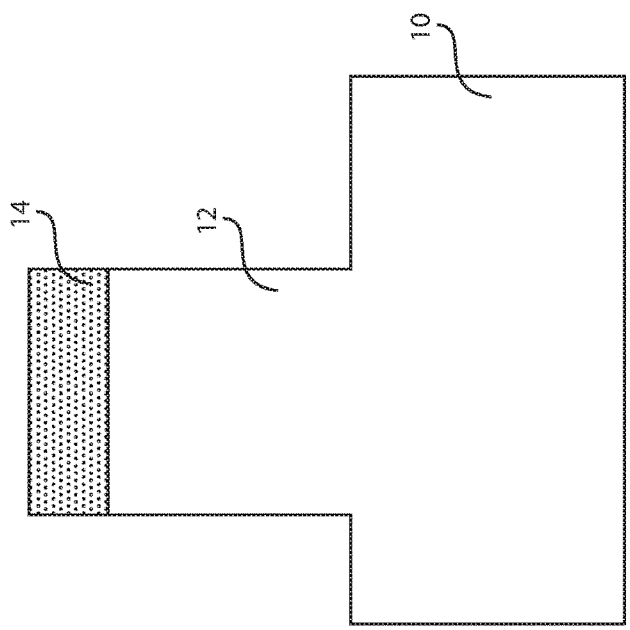
FIG. 4 is a cross-sectional view of the structure of FIG. 3 depicting a cut through the fin along axis A-A', in accordance with the present invention.

FIG. 4 is a cross-sectional view of the structure of FIG. 3 depicting a cut through the fin along axis A-A', in accordance with the present invention.

In various embodiments, the cut is performed along the axis A-A'. The cross-sectional view depicts the substrate 10, the fin 12 formed over the substrate, as well as the hard mask 14 formed over the fin 12.

FIG. 5 is a cross-sectional view of the structure of FIG. 4 where a first source/drain region is formed and a conformal dielectric liner is deposited, in accordance with the present invention.

In various embodiments, a source/drain region 16 is formed over the substrate 10. The source/drain region 16 can be referred to as a doped bottom S/D region 16. The doped bottom S/D region 16 can have a thickness greater than the thickness of the substrate 10.

In various embodiments, a dielectric liner 18 is deposited over the structure. The dielectric liner 18 can be a conformal dielectric liner. The dielectric liner 18 can have a thickness that is greater than 10 nm. The dielectric liner 18 can be, e.g., a silicon nitride (SiN) liner. The liner material can also be another dielectric material, such as a low k material (e.g., SiBCN, SiOC, etc.). The liner 18 covers sidewalls of the fin 12, as well as sidewalls/top surface of the hard mask 14. The liner 18 also covers the exposed portions/sections of the doped bottom S/D region 16. The liner 18 further covers any exposed portions of the substrate 10. The liner 18 covers the entire hard mask 14.

In various embodiments, the doped source/drain 16 is advantageously deposited or formed via epitaxial growth. Depending on how the epitaxial growth develops, it can be necessary to anisotropically etch the epitaxial growth, in order to result in a top surface of the source/drain region 16 that is suitable for subsequent processing. The dopant can be provided to the doped region(s) 16 (e.g., source/drain region(s)) by ion implantation, and source/drains formed by annealing the doped region(s) 16.

Figure 6:
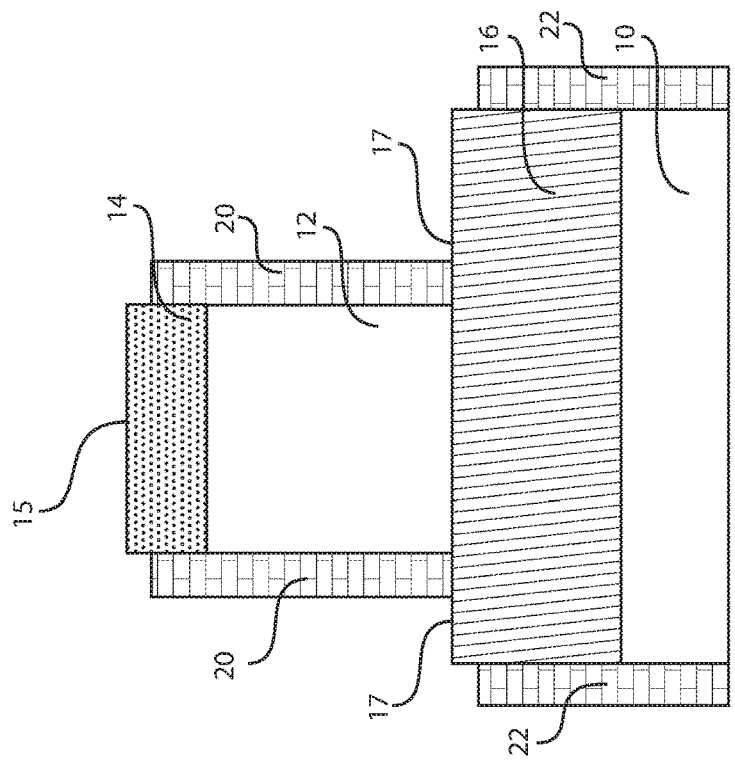
FIG. 6 is a cross-sectional view of the structure of FIG. 5 where etching is performed to create a first set of spacers adjacent the first source/drain region and a second set of spacers adjacent the fin, in accordance with the present invention.

FIG. 6 is a cross-sectional view of the structure of FIG. 5 where etching is performed to create a first set of spacers adjacent the first source/drain region and a second set of spacers adjacent the fin, in accordance with the present invention.

In various embodiments, the dielectric liner 18 is etched to form a first set of spacers 20 adjacent the fin 12 and sidewalls portions of the hard mask 14. The dielectric liner 18 is also etched to form a second set of spacers 22 adjacent the substrate 10 and sidewall portions of the doped bottom S/D 16. The etching can be, e.g., an RIE etch. The etching further results in exposure of the top surface 15 of the hard mask 14. The etching also results in the exposure of top surfaces 17 of the doped bottom S/D 16. The spacers 20 contact the entire sidewall surface of the fin 12. The spacers 22 contact a majority of the sidewall surface of the doped bottom S/D 16.

Figure 7:
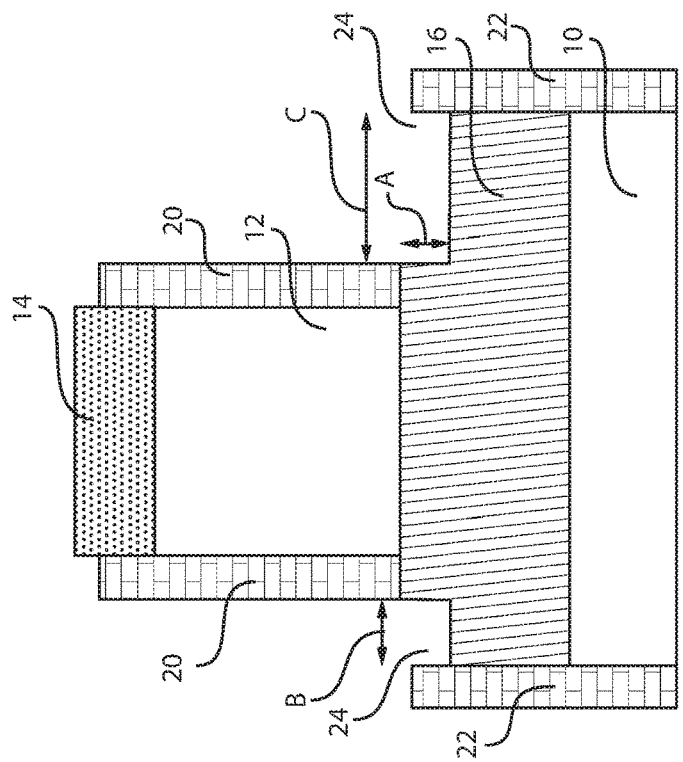
FIG. 7 is a cross-sectional view of the structure of FIG. 6 where the first source/drain region is recessed in exposed areas, in accordance with the present invention.

FIG. 7 is a cross-sectional view of the structure of FIG. 6 where the first source/drain region is recessed in exposed areas, in accordance with the present invention.

In various embodiments, the doped bottom S/D 16 is etched to form recesses 24 in regions that are not covered by the dielectric liner 18 (or the second set of spacers 22). The recesses 24 extend a distance "A" into the doped bottom S/D 16. In one example, the recesses extend a length "B" on one side of the fin 12 and a length "C" on the other side of the fin 12, where the lengths "B" and "C" can be different with respect to each other. Of course, one skilled in the art can contemplate such lengths to be substantially equal.

Figure 8:
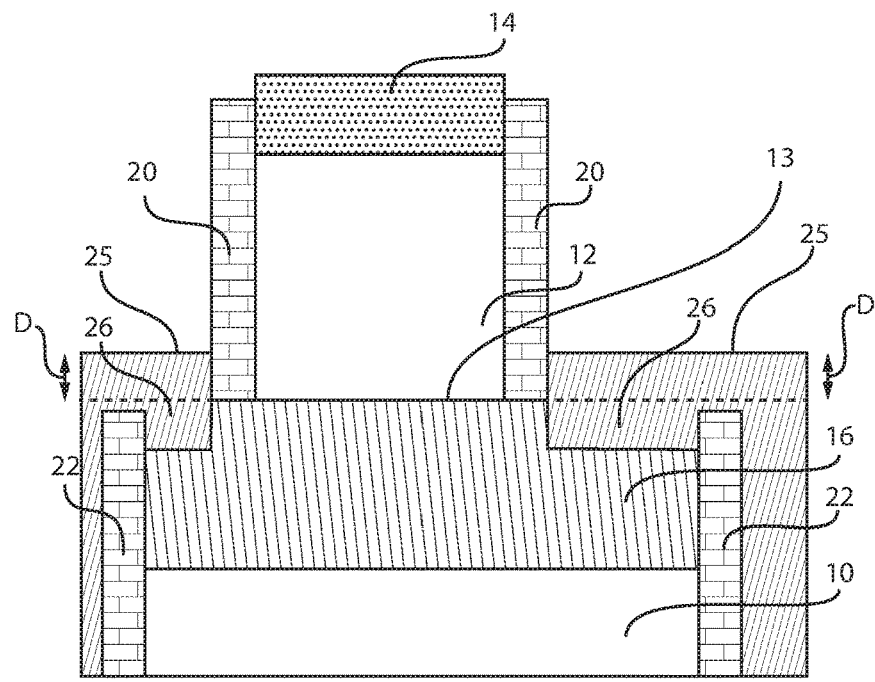
FIG. 8 is a cross-sectional view of the structure of FIG. 7 where a shallow trench isolation (STI) region is formed over the first source/drain regions, in accordance with the present invention.

FIG. 8 is a cross-sectional view of the structure of FIG. 7 where a shallow trench isolation (STI) region is formed over the first source/drain regions, in accordance with the present invention.

In various embodiments, STI regions 26 are formed within the recesses 24. The STI regions 26 cover the entire second set of spacers 22. The STI regions 26 extend a distance or length "D" above the doped bottom S/D 16, such that the STI regions 26 contact a sidewall of the first set of spacers 20. Thus, the STI regions 26 cover the entire recessed areas 24 such that they extend up to the first set of spacers 20. Stated differently, the STI regions 26 are formed and recessed/planarized to a level that is above the bottom section/portion of the fin 12. Therefore, the top surface 25 of the STI regions 26 extends above a bottom surface 13 of the fin 12.

The shallow trench isolation (STI) regions 26 are formed by etching a trench in the doped bottom S/D 16 utilizing a conventional dry etching process such as RIE or plasma etching. The trenches can optionally be lined with a conventional liner material, e.g., silicon nitride or silicon oxynitride, and then CVD or another like deposition process is used to fill the trench with silicon oxide or another like STI dielectric material. The STI dielectric can optionally be densified after deposition. A conventional planarization process such as chemical-mechanical polishing (CMP) can optionally be used to provide a planar structure.

Figure 9:
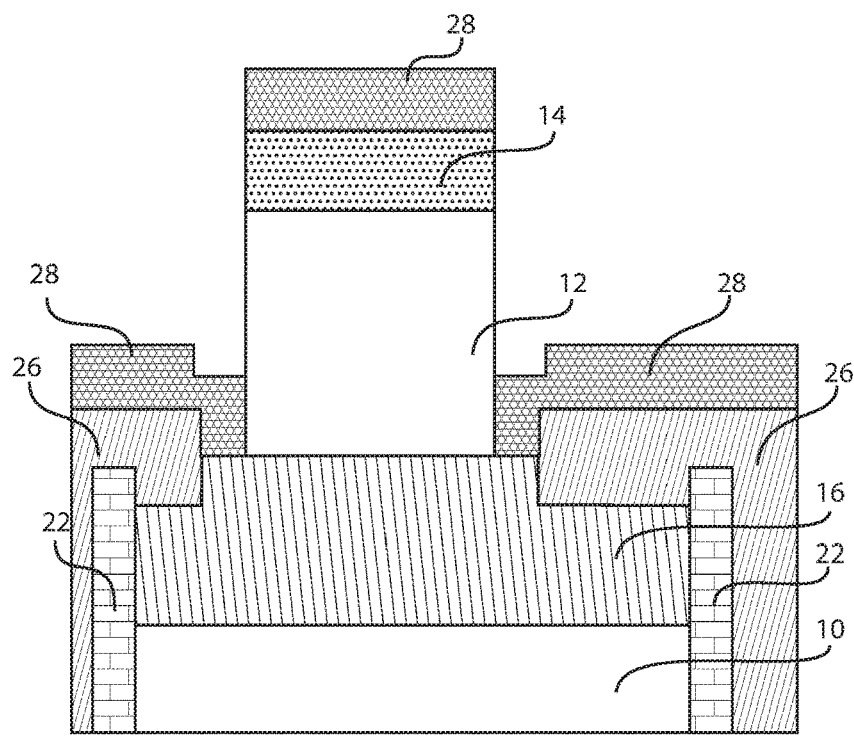
FIG. 9 is a cross-sectional view of the structure of FIG. 8 where the second set of spacers adjacent the fin are selectively removed and a bottom spacer is deposited over the STI and the exposed regions of the first source/drain regions, in accordance with the present invention.

FIG. 9 is a cross-sectional view of the structure of FIG. 8 where the second set of spacers adjacent the fin are selectively removed and a bottom spacer is deposited over the STI and the exposed regions of the first source/drain regions, in accordance with the present invention.

In various embodiments, the first set of spacers 20 are selectively removed and a bottom spacer deposition takes place. In other words, a first spacer or bottom spacer 28 is deposited using a directional deposition method, such as high density plasma deposition (HDP) and gas clustering ion beam deposition (GCIB). Directional deposition means that the deposition occurs preferably on horizontal surfaces rather than vertical surfaces. Following the directional deposition, a wet etching can be performed to remove unwanted bottom spacer material 28 on the vertical surfaces. Thus, the bottom spacer 28 contacts or covers the STI regions 26, as well as the top surface 15 of the hard mask 14. The bottom spacer 28 can be, e.g., a nitride film. In an embodiment, the bottom spacer 28 can be an oxide, for example, silicon oxide (SiO), a nitride, for example, a silicon nitride (SiN), or an oxynitride, for example, silicon oxynitride (SiON).

Figure 10:
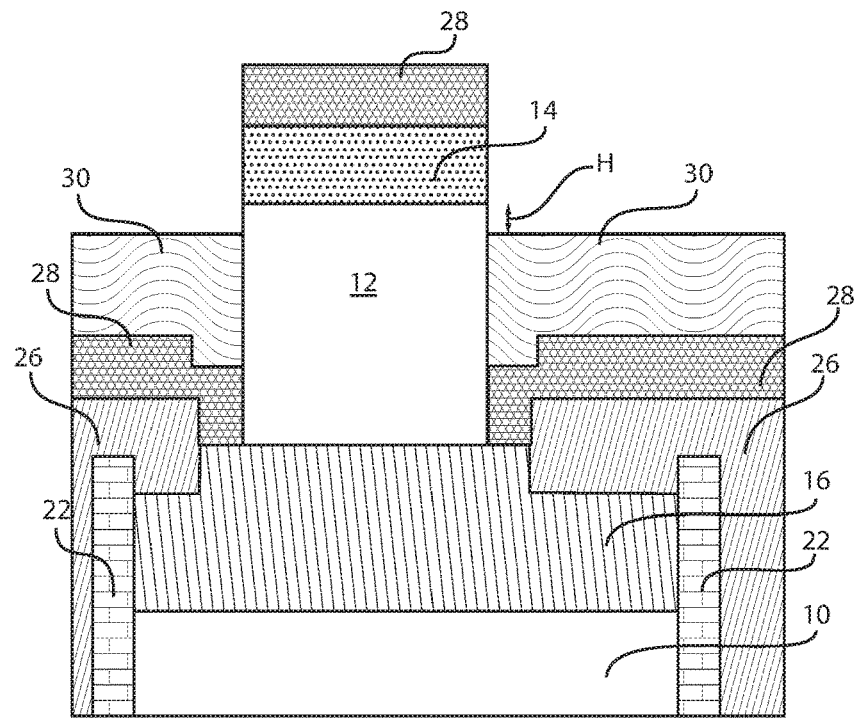
FIG. 10 is a cross-sectional view of the structure of FIG. 9 where a metal gate stack is formed over the bottom spacer, in accordance with the present invention.

FIG. 10 is a cross-sectional view of the structure of FIG. 9 where a metal gate stack is formed over the bottom spacer, in accordance with the present invention.

In various embodiments, a metal gate 30 or high-k metal gate (HKMG) 30 is formed over the bottom spacers 28 that are formed over the STI regions 26. The thickness of the HKMG 30 is greater than the thickness of the bottom spacer 28. The thickness of the HKMG 30 is greater than the thickness of the STI regions 26 formed over the bottom spacer 28. The HKMG 30 extends along the sidewalls of the fin 12. However, the HKMG 30 does not contact the entire sidewall surface of the fin 12. In fact, a length "H" of the sidewall of the fin 12 remains exposed.

In various embodiments, the HKMG 30 can include but is not limited to work function metals such as titanium nitride, titanium carbide, titanium aluminum carbide, tantalum nitride and tantalum carbide; conducting metals such as tungsten, aluminum and copper; and oxides such as silicon dioxide ($SiO_2$), hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$).

Figure 11:
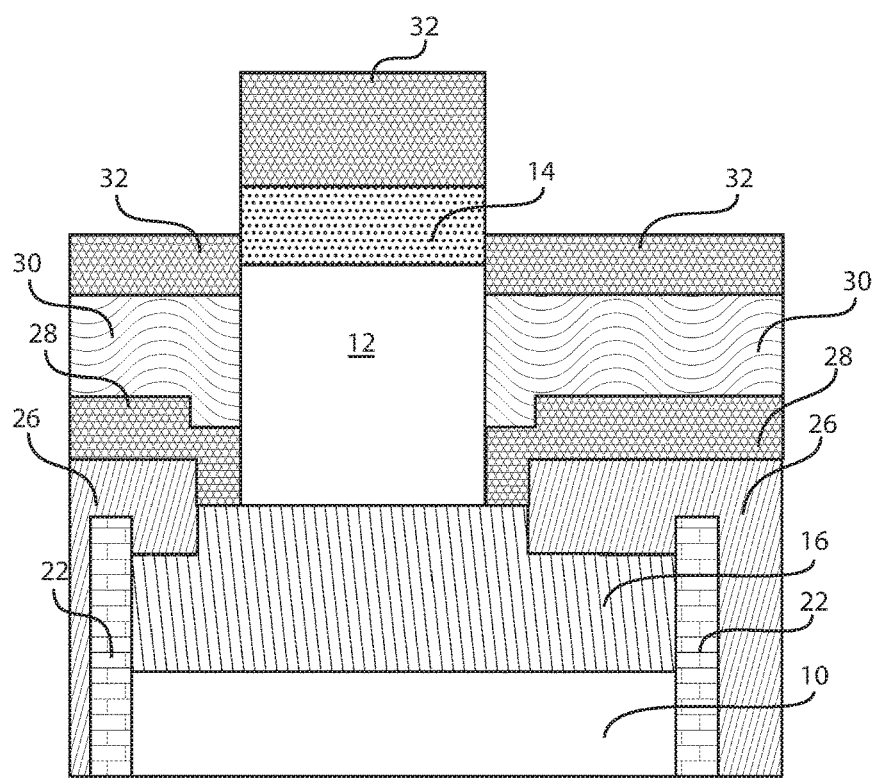
FIG. 11 is a cross-sectional view of the structure of FIG. 10 where a top spacer is formed over the metal gate stack, in accordance with the present invention.

FIG. 11 is a cross-sectional view of the structure of FIG. 10 where a top spacer is formed over the metal gate stack, in accordance with the present invention.

In various embodiments, a top spacer deposition takes place. The top spacer is a second spacer 32, which is deposited and etched back so that the top spacer 32 is deposited over the HKMG 30. The top spacer 32 can be, e.g., a nitride film. In an embodiment, the top spacer 32 can be an oxide, for example, silicon oxide (SiO), a nitride, for example, a silicon nitride (SiN), or an oxynitride, for example, silicon oxynitride (SiON).

Figure 12:
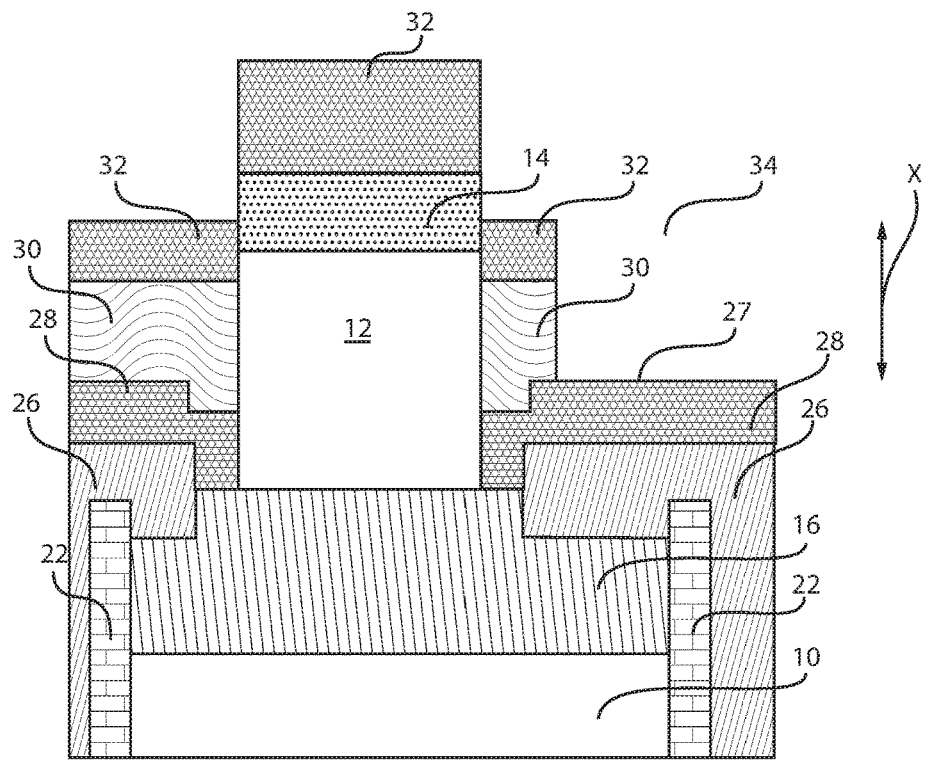
FIG. 12 is a cross-sectional view of the structure of FIG. 11 where the metal gate stack is cut, in accordance with the present invention.

FIG. 12 is a cross-sectional view of the structure of FIG. 11 where the metal gate stack is cut, in accordance with the present invention.

In various embodiments, a gate cut is performed such that a portion of the metal gate 30 is cut away to expose the top surface 27 of the bottom spacer 28. The cut 34 extends a distance "X" to the top surface 27 of the bottom spacer 28.

Figure 13:
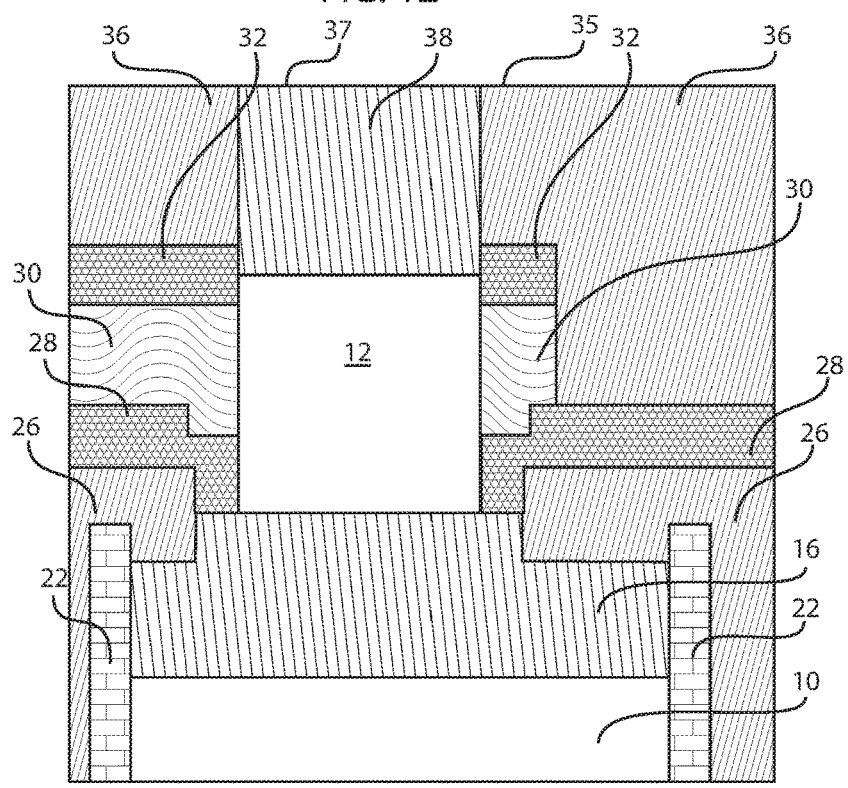
FIG. 13 is a cross-sectional view of the structure of FIG. 12 where a top source/drain region is formed directly over the fin, in accordance with the present invention.

FIG. 13 is a cross-sectional view of the structure of FIG. 12 where a top source/drain region is formed over the fin after selective removal of materials 32 and 14 on top of the fin 12 by etching, in accordance with the present invention.

In various embodiments, an inter-layer dielectric (ILD) oxide fill takes place. The ILD 36 is planarized. The ILD 36 encompasses or envelopes or surrounds the top spacer 32 and in one section and bottom spacer 28 in another section (the cut section). Following the ILD planarization, materials 32 and 14 on top of the fin 12 are selectively removed by an etching process. A doped top source/drain region 38 is then formed over the fin 12.

In one example embodiment, the ILD 36 extends to a top point of the doped top S/D 38. Stated differently, a top surface 35 of the ILD 36 is flush with a top surface 37 of the doped top S/D 38. The doped top S/D 38 can cover the entire top surface of the fin 12. In the gate cut region 34, the ILD 36 contacts the top spacer 32, as well as an exposed sidewall surface of the HKMG 30. The ILD 36 can be selected from the group consisting of silicon containing materials such as $SiO_2$, $Si_3N_4$, $SiO_xN_y$, SiC, SiCO, SiCOH, and SiCH compounds.

Figure 14:
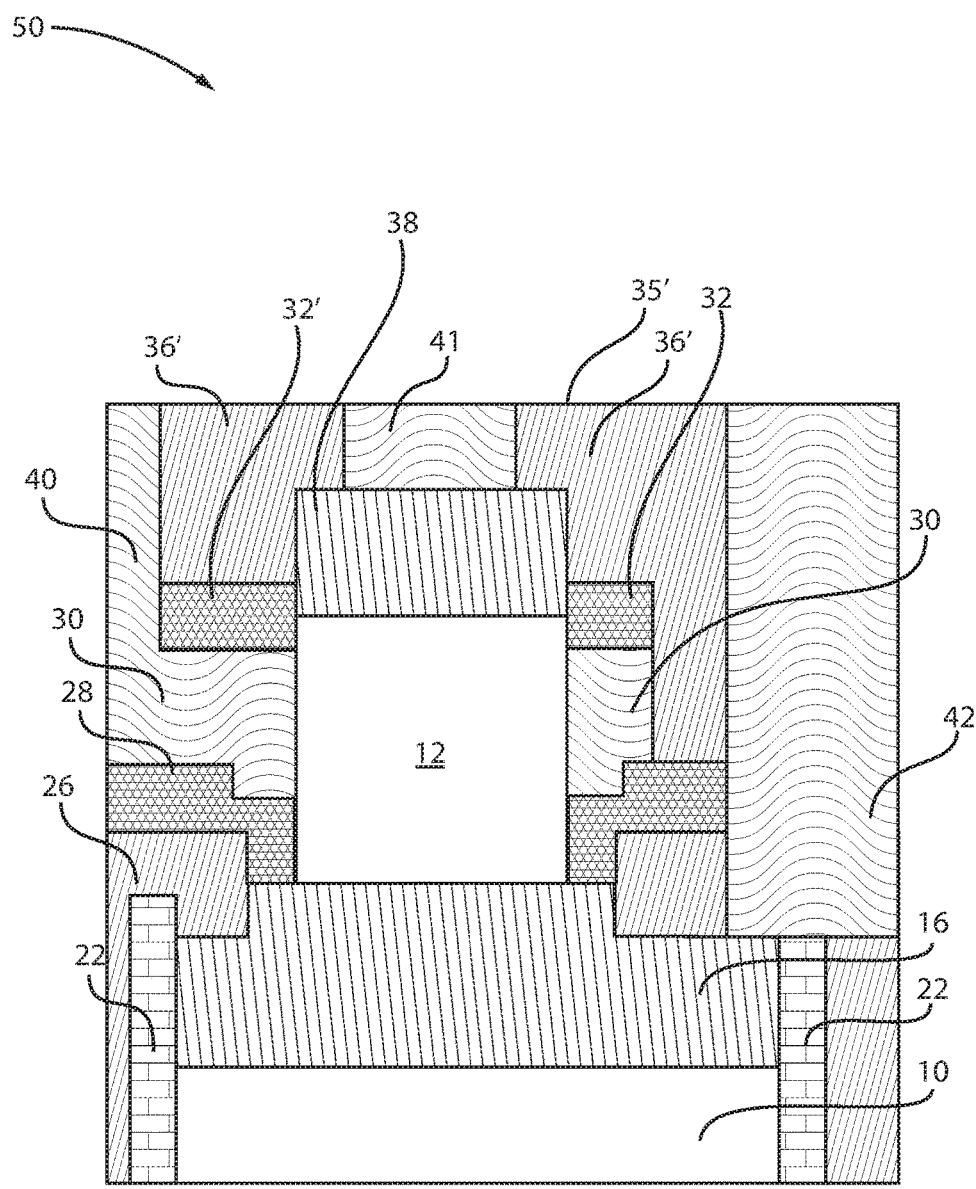
FIG. 14 is a cross-sectional view of the structure of FIG. 13 where top and bottom contacts are formed, in accordance with the present invention.

FIG. 14 is a cross-sectional view of the structure of FIG. 13 where top and bottom contacts are formed, in accordance with the present invention.

In various embodiments, gate contact 40, top contact 41 and bottom contact 42 are formed. The gate contact 40 extends into the HKMG 30. The top contact 41 extends to the doped top S/D 38 formed over the fin 12. The bottom contact 42 extends to a top surface of the doped bottom S/D 16, the top surface of the second spacer 22, and the top surface of the STI region 26. The ILD oxide 36 is further removed to form the contacts 40, 41 and 42. The remaining ILD oxide is designated as 36'. The top surface 35' of the remaining ILD oxide 36' is flush with the top surfaces of contacts 40, 41 and 42. Also, a portion of the top spacer 32 is removed to make way for the gate contact 40. The remaining top spacer can be designated as 32'. The final semiconductor structure 50 is shown in FIG. 14.

In various embodiments, the structure 50 results in gate-to-source/drain capacitances being reduced by extending the STI region 26 between the metal gate stack 30 and the first source/drain region 16. A distance between the metal gate stack 30 and the first source/drain region 16 is greater than about 10 nm. Additionally, the bottom spacer 28 formed over the STI region 26 defines a reverse-stepped structural configuration. Therefore, structure 50 reduces parasitic capacitance by reducing the overlap between the gate and the bottom source/drain (S/D). The distance between the gate and the bottom S/D is extended to be greater than about 10 nm, which in turn increases the Vmax of the device. Moreover, VFETs are formed with hybrid spacers of reverse-stepped shape to further reduce the gate-to-source/drain capacitances and improve the maximum operating voltage.

Figure 15:
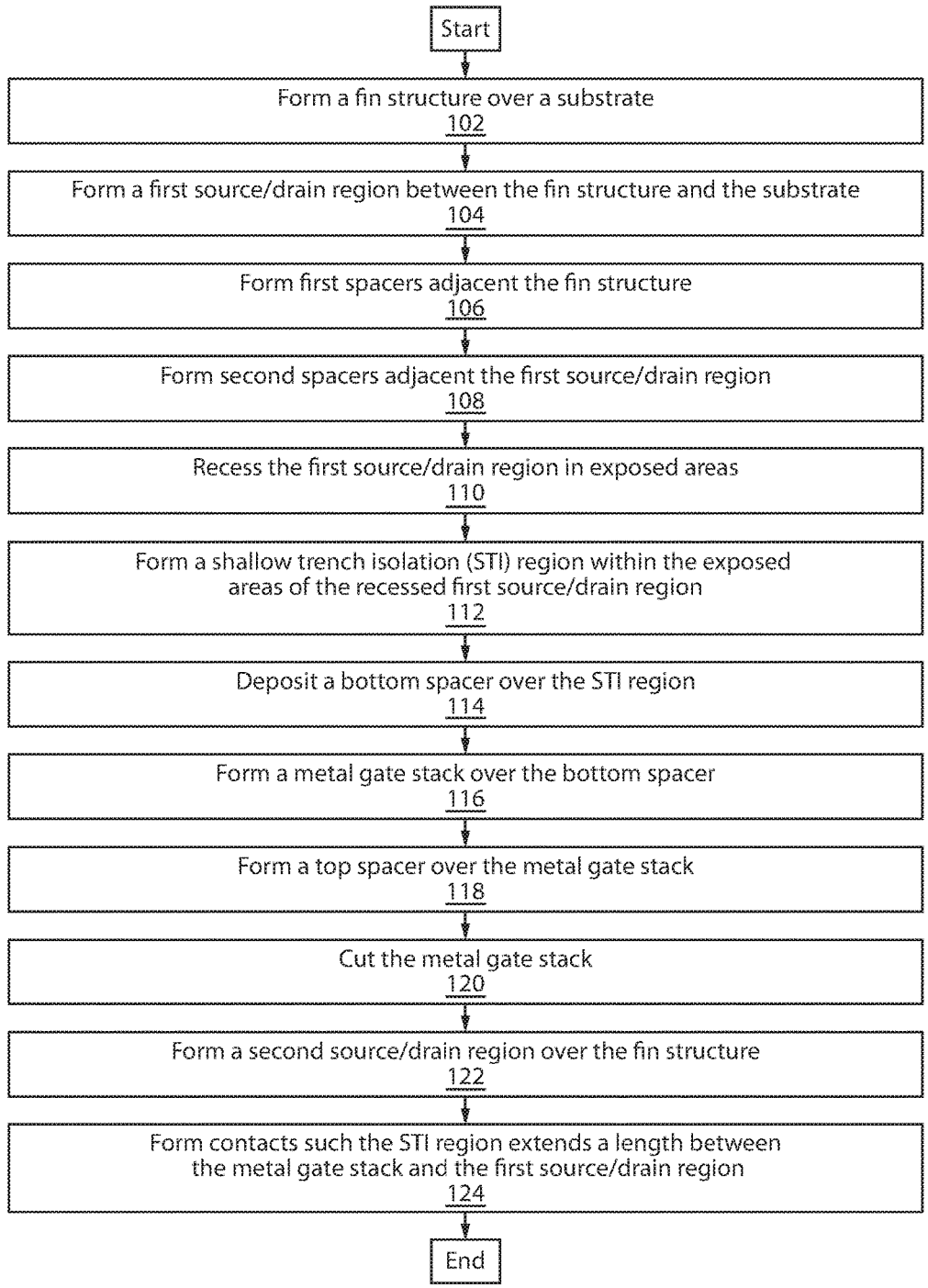
FIG. 15 is a block/flow diagram of a method for reducing parasitic capacitance, in accordance with the present invention.

FIG. 15 is a block/flow diagram of a method for reducing parasitic capacitance, in accordance with the present invention.

At block 102, a fin structure is formed over a substrate.

At block 104, a first source/drain region is formed between the fin structure and the substrate.

At block 106, first spacers are formed adjacent the fin structure. The first spacers are formed by etching a dielectric liner formed adjacent the fin.

At block 108, second spacers are formed adjacent the first source/drain region. The second spacers are formed by etching the dielectric liner adjacent the first source/drain region.

At block 110, the first source/drain region is recessed in exposed areas. The exposed areas are the areas not covered by the dielectric liner.

At block 112, a shallow trench isolation (STI) region is formed within the exposed areas of the recessed first source/drain region. The STI regions also cover the second set of spacers adjacent the first source/drain region.

At block 114, a bottom spacer is deposited over the STI region.

At block 116, a metal gate stack is formed over the bottom spacer.

At block 118, a top spacer is formed over the metal gate stack.

At block 120, the metal gate stack is cut.

At block 122, a second source/drain region is formed directly over the fin structure.

At block 124, contacts are formed such the STI region extends a length between the metal gate stack and the first source/drain region.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which includes multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for reducing parasitic capacitance in vertical FETs (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for reducing parasitic capacitance of a semiconductor structure, the method comprising:
    forming a first source/drain region under a fin structure;
    recessing the first source/drain region in exposed areas;
    forming a shallow trench isolation (STI) region within the exposed areas of the recessed first source/drain region;
    depositing a bottom spacer over the STI region and in direct contact with the first source/drain region, the bottom spacer defining a reverse-stepped structural configuration; and
    forming a metal gate stack over the bottom spacer such that gate-to-source/drain capacitances are reduced by extending the STI region between the metal gate stack and the first source/drain region.

2. The method of claim 1, further comprising forming first spacers adjacent the fin structure.

3. The method of claim 2, further comprising forming second spacers adjacent the first source/drain region.

4. The method of claim 3, further comprising depositing a top spacer over the metal gate stack.

5. The method of claim 4, further comprising cutting the metal gate stack after deposition of the first spacer.

6. The method of claim 5, further comprising forming a second source/drain region over the fin structure after cutting the metal gate stack.

7. The method of claim 6, further comprising forming contacts such that the STI region extends a length between the metal gate stack and the first source/drain region.

8. The method of claim 7, wherein the STI region covers the second spacers adjacent the first source/drain region in their entirety.

9. The method of claim 8, wherein the second spacers adjacent the first source/drain region are selectively removed before the bottom spacer is deposited over the STI region.

10. The method of claim 1, wherein a distance between the metal gate stack and the first source/drain region is greater than about 10 nm.

11. A semiconductor structure for reducing parasitic capacitance, the structure comprising:
    a first source/drain region formed under structure;
    exposed areas formed by recessing the first source/drain region;
    a shallow trench isolation (STI) region formed within the exposed areas of the recessed first source/drain region;
    a bottom spacer deposited over the STI region and in direct contact with the first source/drain region, the bottom spacer defining a reverse-stepped structural configuration; and a metal gate stack formed over the bottom spacer such that gate-to-source/drain capacitances are reduced by extending the STI region between the metal gate stack and the first source/drain region.

12. The structure of claim 11, wherein first spacers are formed adjacent the fin structure.

13. The structure of claim 12, wherein second spacers are formed adjacent the first source/drain region.

14. The structure of claim 13, wherein a top spacer is deposited over the metal gate stack.

15. The structure of claim 14, wherein the metal gate stack is cut after deposition of the first spacer.

16. The structure of claim 15, wherein a second source/drain region is formed over the fin structure after cutting the metal gate stack.

17. The structure of claim 16, wherein contacts are formed such that the STI region extends a length between the metal gate stack and the first source/drain region.

18. The structure of claim 17, wherein the STI region covers the second spacers adjacent the first source/drain region in their entirety.

19. The structure of claim 18, wherein the second spacers adjacent the first source/drain region are selectively removed before the bottom spacer is deposited over the STI region.

20. The structure of claim 11, wherein a distance between the metal gate stack and the first source/drain region is greater than about 10 nm.

* * * * *